United States Patent [19]

Guillet et al.

[11] Patent Number: 4,618,566

[45] Date of Patent: Oct. 21, 1986

[54] FLUORENE CONTAINING COMPOUNDS AND NEGATIVE PHOTORESIST COMPOSITIONS THEREFROM

[75] Inventors: James E. Guillet, Dons Mills; Anthony E. Redpath, Toronto, both of Canada

[73] Assignee: Ecoplastics Limited, Willowdale, Canada

[21] Appl. No.: 666,592

[22] Filed: Oct. 31, 1984

[51] Int. Cl.$^4$ .......................... G03C 1/71; G03C 1/76; C08F 8/00

[52] U.S. Cl. .................................... 430/271; 430/311; 430/270; 526/284; 526/280; 522/159

[58] Field of Search ........................ 430/270, 311, 271; 526/284, 280; 204/159.14; 522/159

[56] References Cited

U.S. PATENT DOCUMENTS

| | | | |
|---|---|---|---|
| 2,476,737 | 7/1949 | Kern et al. | 526/284 X |
| 3,169,060 | 2/1965 | Hoegl | 526/280 X |
| 4,098,984 | 7/1978 | Turner | 526/284 X |

OTHER PUBLICATIONS

E. Gipstein et al., Polymer Letters, 9, 671, (1971).
E. J. Greenhow, E. N. White, D. McNeil, J. Chem. Soc., 2848, (1951).
E. J. Greenhow, E. N. White, D. McNeil, J. Chem. Soc., 986, (1952).

Primary Examiner—John E. Kittle
Assistant Examiner—Cynthia Hamilton
Attorney, Agent, or Firm—Arthur J. Plantamura; Jay P. Friedenson; Patrick L. Henry

[57] ABSTRACT

Polymers of fluorene containing compounds which form crosslinked networks are found to provide useful negative photoresists which are sensitive in the ultraviolet wavelength range of between about 200 nm to 300 nm. When used in negative photoresist compositions, these fluorene compounds produce a high resolution and thus higher information density in microcircuits manufactured using these photoresists.

5 Claims, 1 Drawing Figure

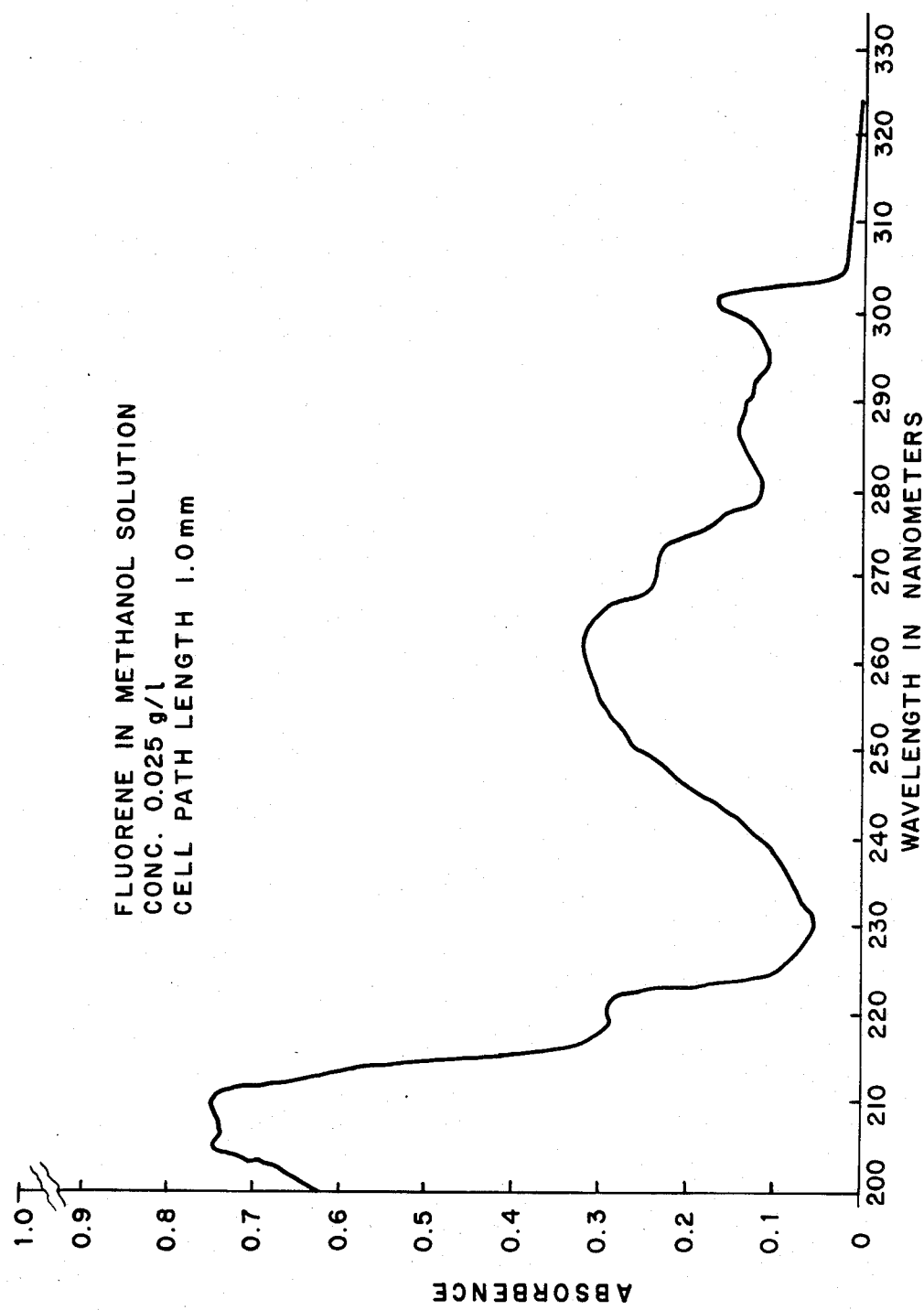

FLUORENE CONTAINING COMPOUNDS AND NEGATIVE PHOTORESIST COMPOSITIONS THEREFROM

BACKGROUND OF THE INVENTION

1. Field of the Invention

This invention relates to novel negative photoresist compositions and to the production of negative photoresist layers. In particular, the invention deals with a novel class of fluorene polymers that when cast in thin films, form crosslinked networks after exposure to radiation such as ultraviolet light, making the materials useful as negative photoresists.

2. DESCRIPTION OF THE PRIOR ART

Photoresists are materials whose solubility in a developer solution is altered after the photoresist has been exposed, to a source of radiation. Photoresist compositions may comprise a photosensitive compound (hereafter sometimes called a sensitizer or photosensitizer) which is blended with a film forming polymeric resin and a solvent. Photoresist compositions may also comprise polymers which, of themselves, are inherently light sensitive. It is with the latter that the present invention is concerned. As a consequence of the exposure to radiation of the photoresist (usually in the form of a thin film), a different solubility rate results between the exposed and unexposed (masked over) portions of the resist film which yields a surface relief pattern after the development. Those photoresists whose solubility is diminished in the exposed regions are referred to as negative photoresists.

The photoresists are applied in any suitable manner, such as by spin coating from an organic solvent or solvent mixture, onto a substrate, such as silicon wafers and chrome plates glass plates. A developer removes the areas of the coated photoresist film that has been exposed to light or other form of irradiation so as to produce a pattern in the photoresist film.

The application of the photosensitive film to various substrates is an essential step in the fabrication of integrated circuits. The substrates are generally silicon wafers which may have a thin oxide coating or other coating such as a silicon nitride or aluminum. The photosensitive film is used to pattern the substrate in a series of steps including exposure, development and substrate etch. It is essential that the mask pattern be accurately reproduced in substrate etch pattern. To achieve this high degree of accuracy, it is essential that the photoresist film be of uniform thickness, have good adhesion to substrates, good contrast in images formed, and good etch resistance properties.

One of the limitations of materials currently used as commercial photoresists is their lack of sensitivity to light at wavelengths much below 300 nm. The resolution attainable with these resists is typically in the 2–4μ range and would be improved were they sensitive to shorter wavelengths of light. There is, therefore, a need for photoresist materials that are sensitive in the deep ultraviolet (UV) light range (200–300 nm), in that such materials permit a higher resolution and thus a higher information density in the microcircuits manufactured using them. This sensitivity in the deep UV light range should of course be accompanied by the other normal attributes, including good contrast in images formed, and good etch resistance properties.

SUMMARY OF THE INVENTION

In accordance with this invention, we have discovered a new class of polymeric negative photoresists whose sensitivity derives from the fluorene chromophore. The fluorene polymers of the kind contemplated by the invention are those comprised of the general formula:

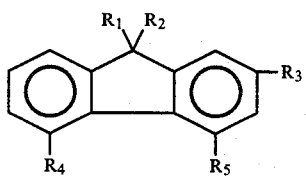

wherein $R_1$, $R_2$ and $R_3$ are the same or different substituents and are selected from the group consisting of hydrogen, radicals of 1 to 6 carbon atoms,

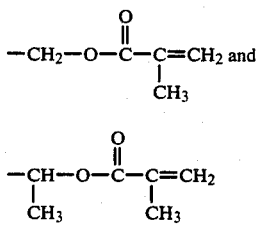

having a polymerizable $>C=C<$ group, and $R_4$ and $R_5$ are the same or different substituents and are selected from the group consisting of hydrogen and alkyl radicals containing 1 to 6 carbon atoms, and copolymers of these fluorene monomers, wherein the fluorene monomer is present in amounts of at least 2 percent by weight. The comonomers which may be copolymerized with the fluorene compounds of the above formula and which may comprise as much as 98% and preferably up to 85% by weight of the total polymer, may be selected from any of the known suitable comonomers that are conducive to the preparation of uniform, thin film formations and which would not interfere with the sensitivity to light of the polymer in the desirable practical wavelength region and do not otherwise impact adversely on the use of the copolymer for photoresist usage.

BRIEF DESCRIPTION OF THE DRAWING

The figure of the drawing illustrates the light absorbance curve of the fluorene chromophore which is incorporated in the polymer of the invention.

DESCRIPTION OF THE PREFERRED EMBODIMENT

The novel fluorene containing polymeric photoresist composition of the invention are characterized by properties that make these compositions suitable for use in the manufacture of semi-conductor components. Solvents which may be employed in applying the photoresist composition may comprise any of various known compounds known to be suitable for, and are compatible in, providing a smooth, uniform thin film. The invention contemplates, in addition to the photoresist composition, also an intermediate article of manufacture comprising a microcircuit element substrate having applied thereon the said polymeric photoresist composition. Typical solvents which may be employed are various compounds known to be useful for producing suitable films include 2 ethoxy ethyl acetate, cyclo hexan, methyl isobutyl ketone, chlorobenzene, toluene and the like.

The novel polymeric negative photoresists of the invention whose sensitivity derives from the fluorene chromophore, and wherein the fluorene structure comprises a substituent group, are represented by the formulae:

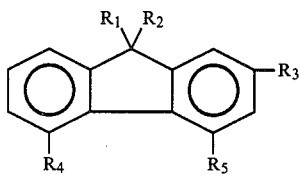

wherein $R_1$, $R_2$ and $R_3$ are the same or different substituents and are selected from the group consisting of hydrogen, alkyl radicals of 1 to 6 carbon atoms, and

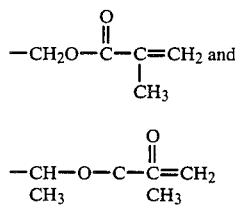

radicals and those radicals having a polymerizable >C=C< group, and $R_4$ and $R_5$ are the same or different substituents and are selected from the group consisting of hydrogen and alkyl radicals containing 1 to 6 carbon atoms, and copolymers of these fluorene monomers wherein the fluorene monomer is present in amounts of at least 2 percent by weight. The comonomers which may be copolymerized with the fluorene compounds of the above formula in amounts of up to as much as 98 percent by weight of the total polymer, but preferably containing at least 5 percent by weight of the total weight of the fluorene containing photoresistive copolymers may be selected from any of the known comonomers which are generally non-light sensitive and are compatible in the preparation of uniform, thin films which are sensitive to light in the practical wavelength region and which do not otherwise interfere with the photoresist usage. Typical comonomers include, for example, addition homopolymers or interpolymers formed by the addition polymerization of one or more unsaturated compounds containing the unit

>C=C< with the resulting copolymer generally having a molecular weight in the range of about 2000 to about 50,000 although they can have higher or lower molecular weights for particular applications.

Unsaturated compounds which can be homopolymerized or interpolymerized by known means and used as polymeric binders include vinyl amines, vinyl imines, substituted and unsubstituted styrenes, acrylates and methacrylates such as alkyl acrylates and alkyl methacrylates, vinyl halides, vinyl esters, vinyl ethers, alkyl vinyl ketones, phenyl vinyl ketone, phenyl isopropenyl ketone, methyl isopropenyl ketone, divinyl ethers, acrylonitrile, mixed esteramides and maleic anhydride, 1,3-butadiene, isoprene, chloroprene, divinylbenzene, acrylic and methacrylic acid derivatives such as nitriles and amides, e.g., acrylamide, and others known to those having ordinary skill in the art.

The fluorene substituted polymers of the invention are sensitive within the region of about 200 nm to about 300 nm (shown in the figure of the drawing) which is within the desirable deep UV sensitivity range described above.

The invention will be further described by reference to the following specific examples. It should be understood, however, that although these examples may describe in detail certain preferred components and/or conditions of the invention, they are given primarily for purposes of illustration and the invention in its broader aspects is not limited thereto.

EXAMPLE I

PREPARATION OF 2-VINYL FLUORENE MONOMER

A necessary precursor for the synthesis of the 2-vinyl fluorene monomer (2VF) is (2-fluorene)-ethanol. This precursor was prepared as follows: 2-acetylfluorene (25.3 gm, 0.12 moles, Aldrich Chemical Company) was dissolved in 250 ml dry tetrahydrofuran. 37 ml of Red -Al, (bis (2-methoxy-ethoxy) aluminum hydride), was added dropwise over a period of 3 hours and 15 minutes. The reaction was done at 0° C. under a blanket of nitrogen. After an additional 45 minutes the reaction was quenched by the dropwise addition of 5% aqueous NaOH (100 ml). The layers were separated and the aqueous layer was washed with methylene chloride (50 ml). The combined organic fractions were dried (Na$_2$SO$_4$) and concentrated to give a solid which was purified by recrystallization from 1:1 toluene/hexane to give 20.0 gm (78%) of pure 2-fluorene)-ethanol (mp 139°–141° C.).

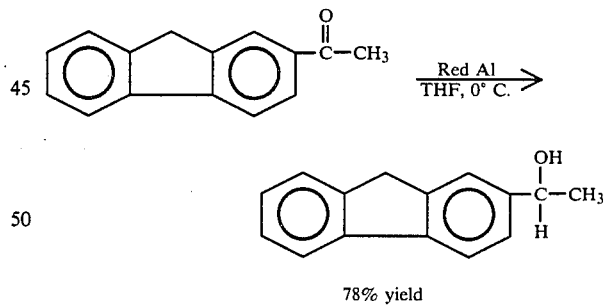

78% yield

Attempts to run this reaction at higher temperature gave little of the desired product.

Once the alcohol was obtained, 2-vinyl fluorene was prepared by dehydration under vacuum with KHSO$_4$ and copper powder according to the procedure of E. Gipstein and coworkers, Polymer Letters 9, 671 (1971).

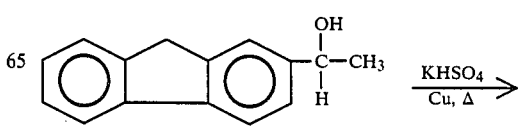

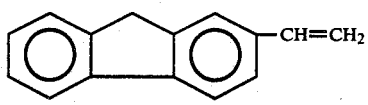

15% yield

The crude product was purified by flash chromatography using 10% ethyl acetate in pentane to yield a white solid product (m.p. 136°–137° C.).

EXAMPLE II

PREPARATION OF (2-FLUORENE) ETHYL METHACRYLATE MONOMER (2-Fluorene) ethanol (5.00 gm; 0.024 moles), of the formula shown in the reaction below, was dissolved in 30 ml dry tetrahydrofuran and 10 ml dry triethylamine at 0° C. The methacrloyl chloride (5 ml) was added dropwise over a period of 5 minutes and the solution was stirred in the cold for 1 hour. Water (25 ml) was then added, the layers separated, and the aqueous fraction washed with methylene chloride (2×25 ml). The combined organic fractions were dried (Na$_2$SO$_4$) and concentrated to give an oil. The oil was flash chromatographed using 10% ethyl acetate in hexane as element. The major component was isolated as a solid which was purified by recrystallization from hexane to give 2.19 gm (31% yield) of (2-fluorene) ethyl methacrylate, m.p. 78°–80° C.

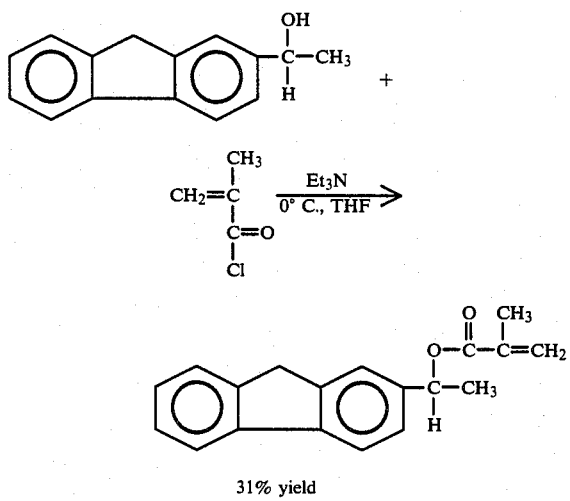

31% yield

EXAMPLE III

PREPARATION OF (9-FLUORENYL) METHYL METHACRYLATE MONOMER AND POLYMER THEREOF

Methacrloyl chloride (5 ml) was added dropwise to a cooled solution of 9-fluorene methanol (Aldrich Chemical Co. 5.04g, 0.026 moles) in a mixture of dry tetrahydrofuran (15 ml) and dry triethylamine (10 ml). After 1 hour at 0° C. the reaction was quenched with water and extracted with ether. The resultant oil was flash chromatographed to give 0.70g, (10% yield) of (9-fluorenyl)-methyl methacrylate (9 FMMA) as a light yellow oil. The original monomer stored at 0° C. polymerized over a period of 3 days. This material was dissolved in and added dropwise to hexane, yielding a precipitate of poly(9 FMMA) ([$\eta$]=0.28 dl/g).

EXAMPLE IV

PREPARATION OF HOMOPOLYMERS AND COPOLYMERS OF 2 VINYL FLUORENE

Concentrated solution polymerizations of three runs P1, P2 and P3, respectively, 2-vinyl fluorene (2VF), 2VF+phenyl vinyl ketone (PVK) and 2VF+phenyl isopropenyl ketone (PIPK) were carried out. In each case the procedure was the same: the monomer(s) was placed in a 6 mm diameter tube, approximately 0.25% azobisisobutyronitrile (AIBN) initiator was added in toluene so as to give a final monomer/solvent ratio of approximately 1/1. The tubes were then flushed with nitrogen and vacuum pumped five times before being left capped under nitrogen. After a variable raction time at 75° C., as shown in Table I the tubes were opened and the polymer was dissolved in toluene; dropwise addition of this solution to methyl alcohol gave a precipitate that was filtered and vacuum dried. Details are given in Table I.

TABLE I

| Poly- | Monomers | | Initi- | Temp., | Time, | Yield |
| --- | --- | --- | --- | --- | --- | --- |
| mer | M$_1$ | M$_2$ | ator | °C. | hr | % |
| P1 | 2VF | — | AIBN | 75 | 40 | 60 |
| P2 | 2VF (66) | PVK (33) | AIBN | 75 | 65 | 95 |
| P3 | 2VF (60) | PIPK (40) | AIBN | 75 | 65 | 27 |

UV Degradation

Solid state UV sensitivity tests, conducted as described below, showed that each of the above polymers crosslinked upon a 60 sec exposure to the full output of a 500w xenon lamp of an Optical Associates Inc., deep UV exposure system.

Measurement of solid state UV sensitivity

The following procedure was employed to test polymer sensitivity.

(i) A solution of ca. 50 mg of polymer is prepared in a 10 ml volumetric flask using a relatively high boiling solvent (e.g., toluene).

(ii) Two 5 ml aliquots are pipetted onto 4" diamter glass discs sitting on a carefully leveled surface. The solvent is allowed to evaporate, leaving a film of nominal thickness ca. 3$\mu$.

(iii) One of the discs is exposed to the desired level of UV light, the other is kept as a control blank.

(iv) Each disc is "developed" by placing it in a well in a custom-machined developing tank and then covering the film with ca. 2 ml of developing solvent (ideally a good solvent for the polymer). The tank is covered to prevent solvent loss by evaporation and left for 15–20 min. The resulting solution is then carefully transferred to a 10 ml volumetric flask. The disc is covered with a second portion of about 2 ml aliquot of solvent and the process is repeated. After a third wash with solvent, the combined washes are made up to the 10 ml level. If the material has crosslinked, it will be observed at this stage that the film remains undissolved. Steps v and vi below are not performed in this case.

(v) The intrinsic viscosity of the solutions (produced in iv) of both exposed and unexposed polymer are then measured.

(vi) The ratio of [$\eta$]unexposed/[$\eta$]exposed is then related to the number of chain scissions per molecule, using the Mark-Houwink relationship, $[\eta]=KM^a$, to determine the relevant molecular weights.

For the three polymer samples P1, P2 and P3 in Table I, unexposed films were dissolved rapidly by toluene. Exposed films did not dissolve following development by step (iv) above—after 72 hours contact with toluene, there remained insoluble material for all three polymers.

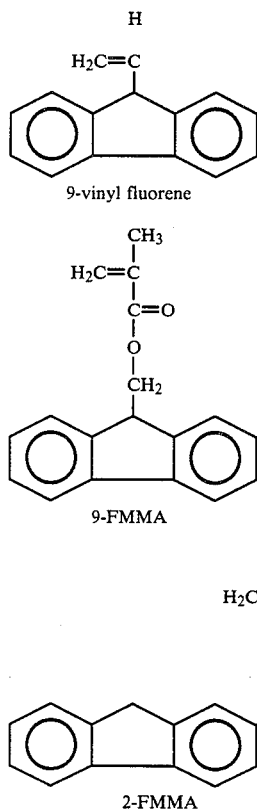

9-vinyl fluorene

9-FMMA

2-FMMA

It will be apparent that various modifications may be made by one skilled in the art within the scope of, and without departing from the spirit of, the present invention.

What is claimed is:

1. An article of manufacture comprising an integrated circuit substrate element having applied thereon a thin homogeneous film sensitive in the deep UV light range of a composition comprising a ploymer of a fluorene monomer selected from the group consisting of monomers of the formula:

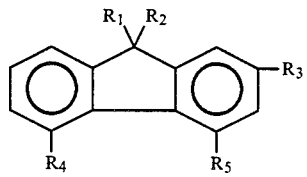

wherein $R_1$, $R_2$ and $R_3$ are the same of different substituents and are selected from the group consisting of hydrogen, alkyl radicals or 1 to 6 carbon atoms,

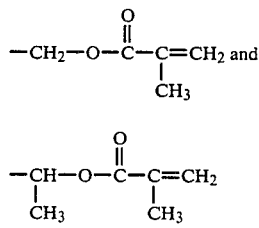

radicals and at least one $R_1$, $R_2$ and $R_3$ having a polymerizable $>C=C<$, group, and $R_4$ and $R_5$ are the same or different substituents are selected from the group consisting of hydrogen and alkyl radicals containing 1 to 6 carbon atoms, and copolymers of these fluorene monomers wherein the fluorene monomer is present in amounts of at least 2 percent by weight.

2. The photoresist composition of claim 1 wherein the comonomer polymerized with the fluorene monomer is selected to produce a polymer from the group consisting of homopolymers or interpolymers formed by the addition polymerization of one or more unsaturated compounds containing the polymerizable vinyl unit $>C=C<$.

3. The photoresist of claim 2 wherein the $>C=C<$ compound is ethyl methacrylate.

4. the photoresist of claim 2 wherein the $>C=C<$ compound is methyl methacrylate.

5. An intermediate article of manufacture comprising a microcircuit element substrate having applied thereon a homogeneous thin film of the composition of claim 1.

* * * * *